United States Patent
Isoda

(10) Patent No.: US 8,174,317 B2
(45) Date of Patent: May 8, 2012

(54) FULLY-DIFFERENTIAL AMPLIFIER CIRCUIT

(75) Inventor: Naoki Isoda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/776,354

(22) Filed: May 7, 2010

(65) Prior Publication Data

US 2010/0289582 A1    Nov. 18, 2010

(30) Foreign Application Priority Data

May 15, 2009 (JP) ................................. 2009-119076
Apr. 22, 2010 (JP) ................................. 2010-099067

(51) Int. Cl.
*H03F 3/45* (2006.01)
(52) U.S. Cl. ........................................ 330/253; 330/255
(58) Field of Classification Search ........... 330/252–261
See application file for complete search history.

(56) References Cited

U.S. PATENT DOCUMENTS

| 7,755,411 | B2 | 7/2010 | Isoda |
| 7,768,352 | B2 * | 8/2010 | Sutardja ........................ 330/259 |
| 2011/0018633 | A1 * | 1/2011 | Hsieh ........................... 330/253 |

FOREIGN PATENT DOCUMENTS

JP    6-029761 A    2/1994

OTHER PUBLICATIONS

Kapusta et al., "A 14b 74MS/s CMOS AFE for True High-Definition Camcorders", IEEE International Solid-State Circuits Conference, Session 27, Image Sensors, 27.6 (2006).

* cited by examiner

*Primary Examiner* — Hieu Nguyen
(74) *Attorney, Agent, or Firm* — Fitzpatrick, Cella, Harper & Scinto

(57) ABSTRACT

A fully-differential amplifier circuit comprises a differential amplifier configured to differentially amplify first and second input signals serving as an input differential pair to generate a pair of first and second intermediate signals, first and second class AB amplifiers configured to amplify the first and second intermediate signals to generate first and second output signals, wherein the first and second output signals serve as an output differential pair, the first class AB amplifier amplifies the first intermediate signal with reference to a reference voltage adjusted by a first feedback signal that is a common mode component of the first output signal and the second output signal, and the second class AB amplifier amplifies the second intermediate signal with reference to a reference voltage adjusted by a second feedback signal that is a common mode component of the first output signal and the second output signal.

5 Claims, 5 Drawing Sheets

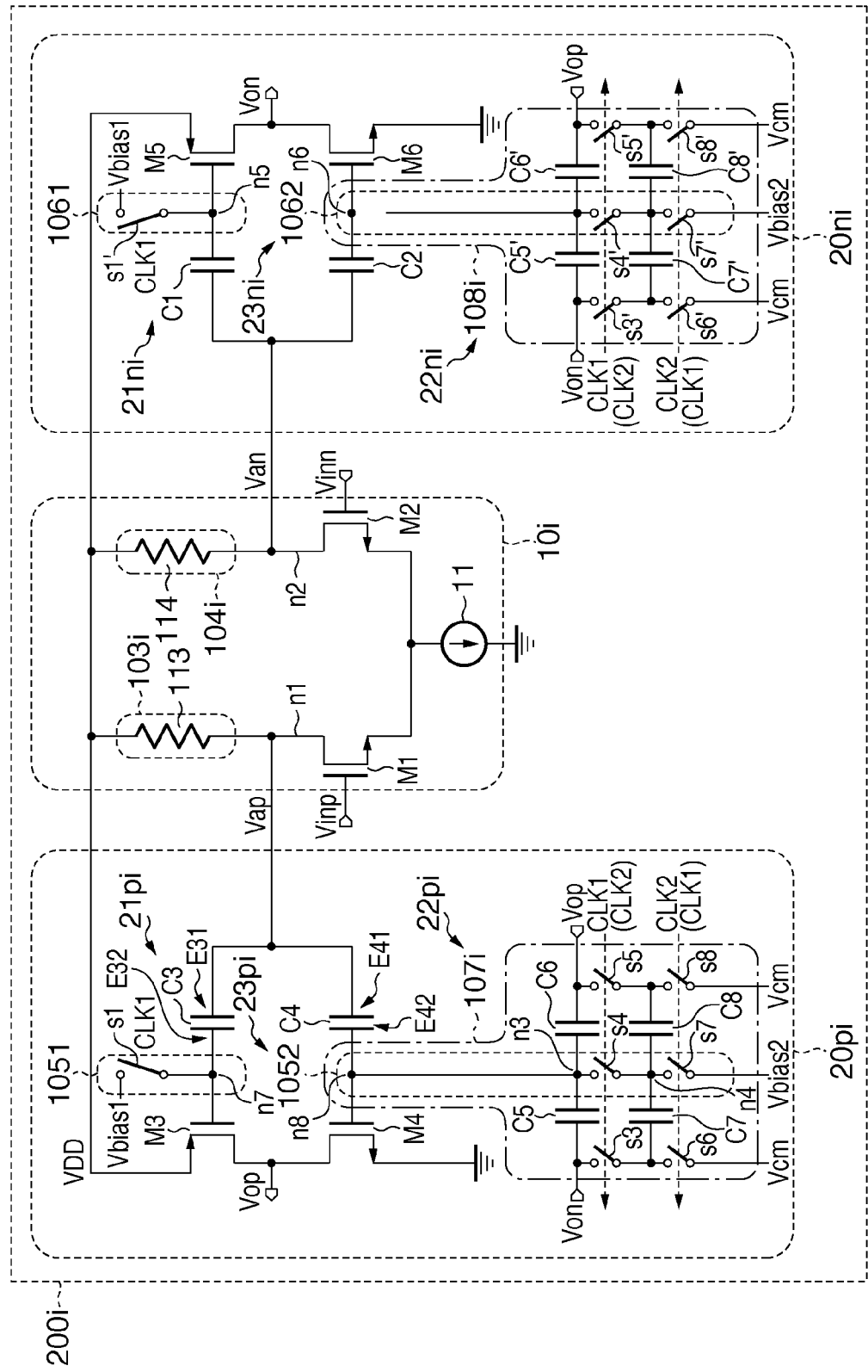
F I G. 3

FULLY-DIFFERENTIAL AMPLIFIER CIRCUIT

BACKGROUND OF THE INVENTION

1. Field of the Invention

The present invention relates to a fully-differential amplifier circuit.

2. Description of the Related Art

A wideband fully-differential amplifier with a two-stage amplification configuration is applied to a switched capacitor circuit such as an S/H. When this amplifier includes a class A amplifier with a high cutoff frequency in the first stage, and a common-source class AB amplifier in the second stage, it is possible to obviate the need for phase compensation and to reduce power consumption.

Moreover, when a dynamic bias circuit which performs not a continuous time operation but a clock operation is adopted as a bias circuit in the common-source class AB amplifier in the second stage, it is possible to simplify the overall circuit and to further reduce power consumption (see "A 14b 74 MS/s CMOS AFE for True High-Definition Camcorders" (2006 ISSCC)).

A fully-differential amplifier requires that the output common mode potential is set to a desired reference signal such as a signal common mode voltage (to be referred to as Vcm hereinafter). This function is realized by a common mode feedback circuit (to be referred to as a CMFB circuit hereinafter), which detects the common mode components of all output signals and provides feedback signals to the fully-differential amplifier in accordance with the differences between the detection results and Vcm.

FIG. 1 in Japanese Patent Laid-Open No. 6-29761 describes a differential amplifier 20 in which a common mode feedback circuit 50 detects the common mode components of a plurality of signals output from a differential portion 30, and feeds back feedback signals proportional to the detected differences to the differential portion 30. According to Japanese Patent Laid-Open No. 6-29761, this makes it possible to prevent a common mode voltage from drifting from a predetermined reference voltage.

In the differential amplifier described in Japanese Patent Laid-Open No. 6-29761, the common mode feedback circuit 50 feeds back feedback signals to the differential portion 30. For this reason, an additional inverting amplifier 54 is required to invert the feedback signals, which may increase power consumption. Also, three phase delay factors (three pairs of capacitance elements and resistance elements) are present in the path of the common mode feedback circuit 50. For this reason, a design burden to satisfy a given stability of a feedback operation may increase and power consumption may increase. Furthermore, an autozeroing technique is necessary to eliminate any flicker noise of the amplifier in the first stage, and this inevitably increases power consumption to meet a given stability.

SUMMARY OF THE INVENTION

The present invention reduces power consumed in a common mode feedback operation by a fully-differential amplifier circuit. The present invention also reduces power, consumed in noise elimination, by eliminating any flicker noise of an amplifier in the first stage without using any autozeroing technique.

One of the aspects of the present invention provides a fully-differential amplifier circuit comprising a differential amplifier configured to differentially amplify a first input signal and a second input signal serving as an input differential pair to generate a pair of a first intermediate signal and a second intermediate signal, a first class AB amplifier configured to amplify the first intermediate signal to generate a first output signal, and a second class AB amplifier configured to amplify the second intermediate signal to generate a second output signal, wherein the first output signal and the second output signal serve as an output differential pair, the first class AB amplifier amplifies the first intermediate signal with reference to a reference voltage adjusted by a first feedback signal that is a common mode component of the first output signal and the second output signal, and the second class AB amplifier amplifies the second intermediate signal with reference to a reference voltage adjusted by a second feedback signal that is a common mode component of the first output signal and the second output signal.

Further features of the present invention will become apparent from the following description of exemplary embodiments with reference to the attached drawings.

BRIEF DESCRIPTION OF THE DRAWINGS

FIG. 3 is a circuit diagram illustrating an example of the circuit configuration of a fully-differential amplifier circuit 200$i$ according to the first embodiment of the present invention;

DESCRIPTION OF THE EMBODIMENTS

Figure 1:
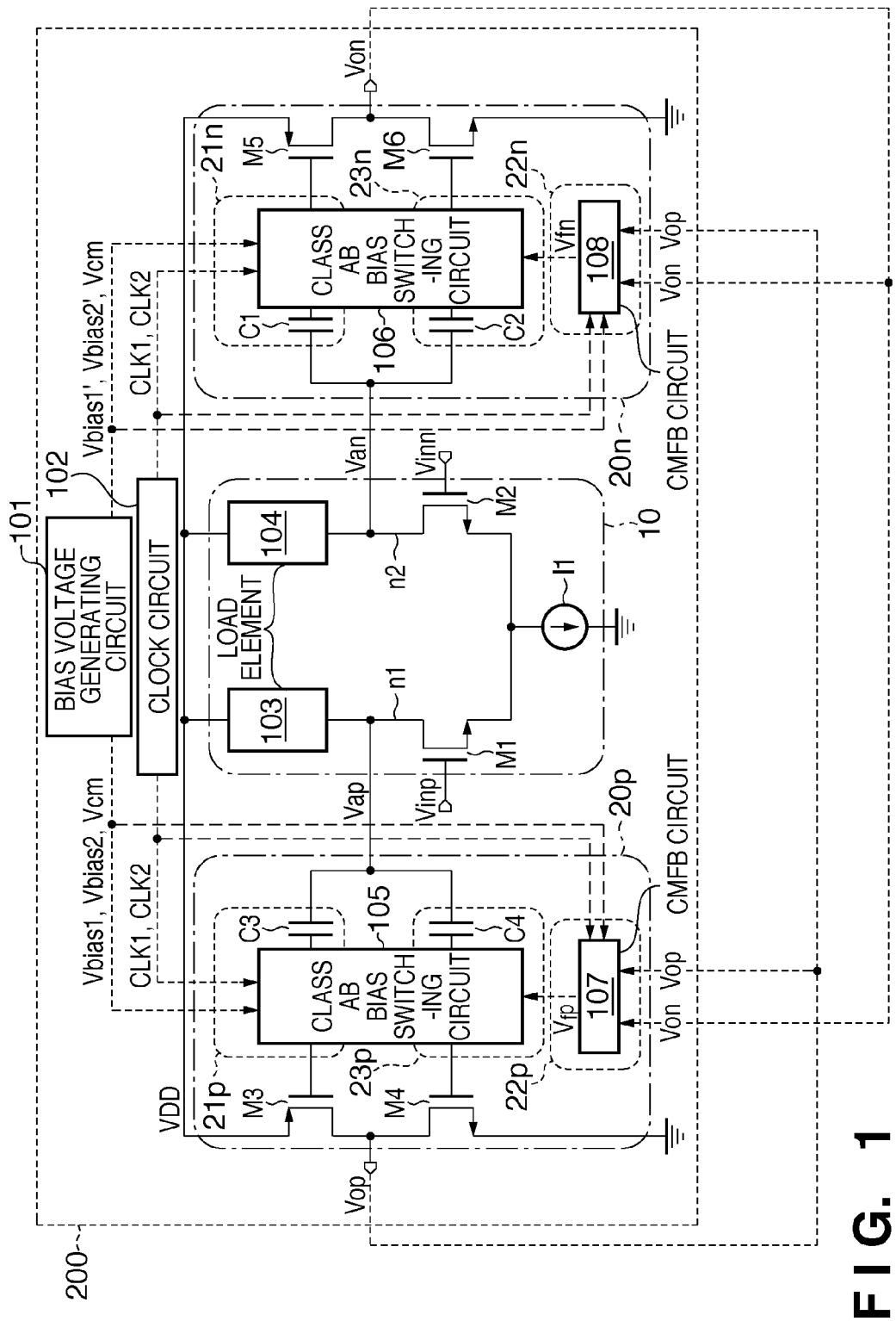
FIG. 1 is a circuit diagram showing the configuration of a fully-differential amplifier circuit 200 according to an embodiment of the present invention.

A fully-differential amplifier circuit 200 according to an embodiment of the present invention will be explained with reference to FIGS. 1 and 3. FIG. 1 is a circuit diagram showing the configuration of the fully-differential amplifier circuit 200 according to the embodiment of the present invention. FIG. 3 is a circuit diagram illustrating the configuration of a fully-differential amplifier circuit 200$i$ according to the first embodiment, in which the fully-differential amplifier circuit 200 is embodied.

The fully-differential amplifier circuit 200 is a two-stage amplification type amplifier circuit. The fully-differential amplifier circuit 200 receives two input signals (a first input signal and a second input signal) Vinp and Vinn serving as an input differential pair, and outputs two output signals (a first output signal and a second output signal) Vop and Von serving as an output differential pair. The fully-differential amplifier circuit 200 includes a clock circuit 102, a bias voltage generating circuit (supplying portion) 101, a differential amplifier 10, and two class AB amplifiers 20$p$ and 20$n$.

Figure 2:
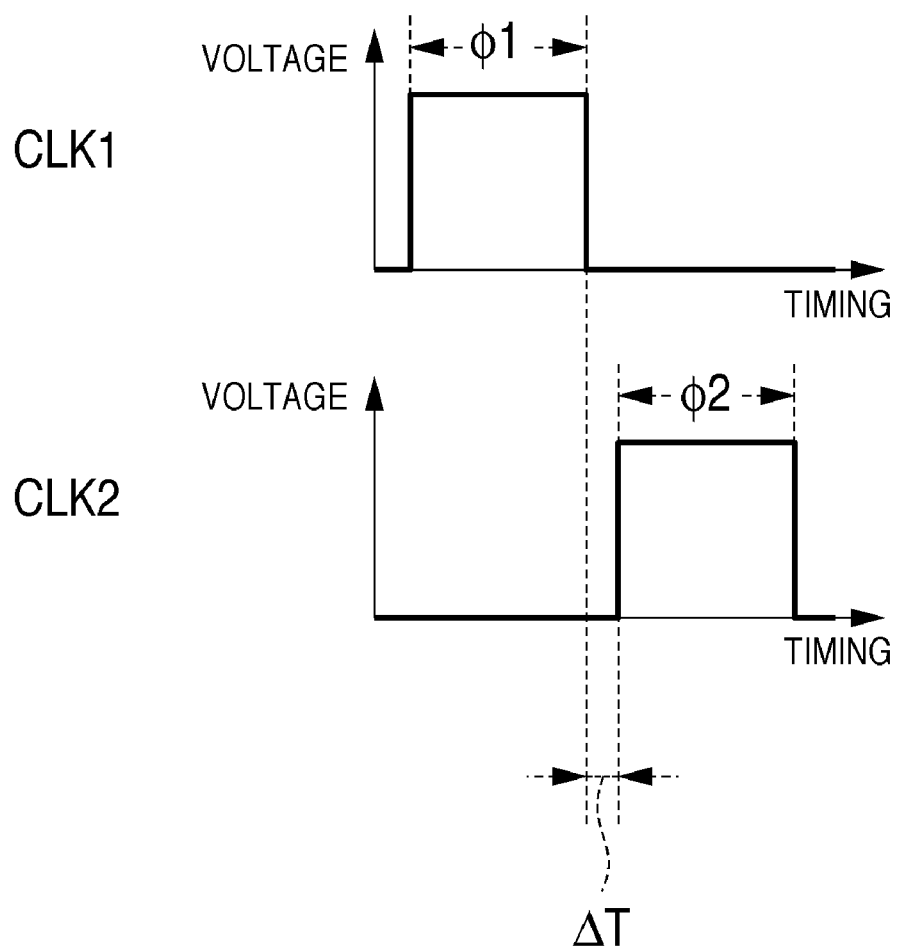
FIG. 2 is a timing chart showing the waveforms of clock signals in the embodiment of the present invention.

The clock circuit 102 supplies a first clock signal CLK1 and a second clock signal CLK2 to each of the two class AB amplifiers 20$p$ and 20$n$. Since the fully-differential amplifier circuit 200 is assumed to be applied to discrete-time signal processing such as an S/H, the clock circuit 102 generates two-phase non-overlapping clocks such as the first clock signal CLK1 and second clock signal CLK2 that are shown in FIG. 2 and will be described later. A period φ1 in which the first clock signal CLK1 is at H level and a period φ2 in which the second clock signal CLK2 is at H level do not overlap each other and have a time interval equal to a non-overlapping period ΔT.

The bias voltage generating circuit 101 supplies bias voltages to each of the two class AB amplifiers 20p and 20n. The bias voltages output from the bias voltage generating circuit 101 can include a first bias voltage Vbias1, second bias voltage Vbias2, third bias voltage Vbias1', fourth bias voltage Vbias2', and common level reference signal (common mode voltage) Vcm. The first bias voltage Vbias1 and second bias voltage Vbias2 are necessary for class AB biasing in the class AB amplifier 20p. The third bias voltage Vbias1' and fourth bias voltage Vbias2' are necessary for class AB biasing in the class AB amplifier 20n. The first bias voltage Vbias1 can be equal to the third bias voltage Vbias1'. The second bias voltage Vbias2 can be equal to the fourth bias voltage Vbias2'. The common level reference signal Vcm is necessary for a common mode feedback operation (to be referred to as a CMFB operation hereinafter).

The differential amplifier 10 performs the first-stage amplification. The differential amplifier 10 performs differential amplification of the pair of two input signals Vinp and Vinn. With this operation, the differential amplifier 10 generates and outputs a pair of two intermediate signals (a first intermediate signal and a second intermediate signal) Vap and Van. The differential amplifier 10 outputs the intermediate signal Vap to the class AB amplifier 20p, and outputs the intermediate signal Van to the class AB amplifier 20n. The differential amplifier 10 includes an input transistor M1, an input transistor M2, load elements 103 and 104, and a current source I1.

The class AB amplifier (first class AB amplifier) 20p amplifies the intermediate signal Vap. The class AB amplifier 20p amplifies the intermediate signal Vap with reference to a reference voltage adjusted using a feedback signal (first feedback signal) Vfp as the common mode component of the first output signal Vop and the second output signal Von. More specifically, the class AB amplifier 20p adjusts a first reference signal or a second reference signal using the feedback signal Vfp during the period in which the intermediate signal Vap is sampled, and amplifies the intermediate signal Vap with reference to the first reference signal and the second reference signal during the period in which the intermediate signal Vap is held. With this operation, the class AB amplifier 20p generates and outputs an output signal Vop. The class AB amplifier 20p includes a PMOS transistor (first PMOS transistor) M3, NMOS transistor (first NMOS transistor) M4, first transfer portion 21p, second transfer portion 23p, and adjuster (first adjuster) 22p.

The PMOS transistor M3 has its source connected to a power supply potential VDD, its drain connected to the drain of the NMOS transistor M4, and its gate connected to the first transfer portion 21p. The PMOS transistor M3 outputs an output signal Vop from its drain.

The NMOS transistor M4 has its source connected to the ground potential, its drain connected to the drain of the PMOS transistor M3, and its gate connected to the second transfer portion 23p. The NMOS transistor M4 outputs an output signal Vop from its drain commonly shared with the PMOS transistor M3.

The first transfer portion 21p obtains the difference of the intermediate signal Vap with respect to a first reference signal held at a first reference node n7 (FIG. 3) to generate a first signal in synchronism with the first clock signal CLK1, and transfers it to the gate of the PMOS transistor M3. The first transfer portion 21p includes a capacitor C3 and a part of a class AB bias switching circuit 105.

The second transfer portion 23p obtains the difference of the intermediate signal Vap with respect to a second reference signal held at a second reference node n8 (FIG. 3) to generate a second signal in synchronism with the first clock signal CLK1, and transfers it to the gate of the NMOS transistor M4. The second transfer portion 23p includes a capacitor C4 and another part of the class AB bias switching circuit 105.

The first transfer portion 21p and second transfer portion 23p perform class AB biasing for the PMOS transistor M3 and NMOS transistor M4, respectively. This attains a low power consumption operation. A class AB biasing method is realized in, for example, the following way. After appropriate charges are sampled in the capacitors C3 and C4 during the period in which the first clock signal CLK1 is at H level, the capacitors C3 and C4 operate as offset voltage sources during the period in which the first clock signal CLK1 is at L level.

The adjuster 22p adjusts the first reference signal or the second reference signal using the feedback signal Vfp in synchronism with one of the first clock signal CLK1 and the second clock signal CLK2. The feedback signal Vfp corresponds to the common mode component of the pair of two output signals Vop and Von. The adjuster 22p includes a CMFB circuit 107. The CMFB circuit 107 receives the pair of two output signals Von and Vop, the common level reference signal Vcm, the first clock signal CLK1, and the second clock signal CLK2. The CMFB circuit 107 supplies the feedback signal Vfp to the first reference node n7 or second reference node n8 so as to maintain the common mode component of the two output signals Vop and Von at an appropriate value. That is, the CMFB circuit 107 obtains the difference of the common mode component of the two output signals Vop and Von with respect to the common level reference signal Vcm to generate a feedback signal Vfp in synchronism with the first clock signal CLK1 or second clock signal CLK2. The CMFB circuit 107 supplies the generated feedback signal Vfp to the first reference node n7 or second reference node n8 to control (adjust) the bias voltage (reference signal) of the gate of the PMOS transistor or NMOS transistor.

As shown in FIG. 3, when the adjuster 22p supplies the feedback signal Vfp to the second reference node n8, the first transfer portion 21p and the second transfer portion 23p perform the following operation. The first bias voltage Vbias1 is held at the first reference node n7 as a first reference signal. The first transfer portion 21p obtains the difference of the intermediate signal Vap with respect to the first reference signal to generate a first signal in synchronism with the first clock signal CLK1, and transfers it to the gate of the PMOS transistor M3. The second transfer portion 23p holds a voltage, obtained by adding the feedback signal Vfp to the second bias voltage Vbias2, at the second reference node n8 as a second reference signal. That is, the second transfer portion 23p receives the second bias voltage Vbias2 as a second reference signal before adjustment, and adjusts the second bias voltage Vbias2 using the feedback signal Vfp, thereby obtaining the adjusted second reference signal. The second transfer portion 23p obtains the difference of the intermediate signal Vap with respect to the adjusted second reference signal to generate a second signal. The second transfer portion 23p transfers the generated second signal to the gate of the NMOS transistor M4. With this operation, the PMOS transistor M3 and NMOS transistor M4 perform an amplification operation so that the common mode component of the pair of two output signals Vop and Von becomes the reference value (common level reference signal Vcm) to generate and output an output signal Vop.

Referring to FIG. 1 again, a class AB amplifier (second class AB amplifier) 20n amplifies the intermediate signal Van. The class AB amplifier 20n amplifies the intermediate signal Van with reference to a reference voltage adjusted using a feedback signal (second feedback signal) Vfn that is the common mode component of the first output signal Vop and the second output signal Von. More specifically, the class AB amplifier 20n adjusts a third reference signal or a fourth reference signal using the feedback signal Vfn during the period in which the intermediate signal Van is sampled, and amplifies the intermediate signal Van with reference to the third reference signal and the fourth reference signal during the period in which the intermediate signal Van is held. With this operation, the class AB amplifier 20n generates and outputs an output signal Von. The class AB amplifier 20n includes a PMOS transistor (second PMOS transistor) M5, NMOS transistor (second NMOS transistor) M6, third transfer portion 21n, fourth transfer portion 23n, and adjuster (second adjuster) 22n.

The PMOS transistor M5 has its source connected to the power supply potential VDD, its drain connected to the drain of the NMOS transistor M6, and its gate connected to the third transfer portion 21n. The PMOS transistor M5 outputs an output signal Von of the two output signals from its drain.

The NMOS transistor M6 has its source connected to the ground potential, its drain connected to the drain of the PMOS transistor M5, and its gate connected to the fourth transfer portion 23n. The NMOS transistor M6 outputs an output signal Von from its drain commonly shared with the PMOS transistor M5.

The third transfer portion 21n obtains the difference of the intermediate signal Van with respect to a third reference signal held at a third reference node n5 to generate a third signal in synchronism with the first clock signal CLK1, and transfers it to the gate of the PMOS transistor M5. The third transfer portion 21n includes a capacitor C1 and a part of a class AB bias switching circuit 106.

The fourth transfer portion 23n obtains the difference of the intermediate signal Van with respect to a fourth reference signal held at a fourth reference node n6 to generate a fourth signal in synchronism with the first clock signal CLK1, and transfers it to the gate of the NMOS transistor M6. The fourth transfer portion 23n includes a capacitor C2 and another part of the class AB bias switching circuit 106.

The third transfer portion 21n and fourth transfer portion 23n perform class AB biasing for the PMOS transistor M5 and NMOS transistor M6. This attains a low power consumption operation. A class AB biasing method is realized in, for example, the following way. After appropriate charges are sampled in the capacitors C1 and C2 during the period in which the first clock signal CLK1 is at H level, the capacitors C1 and C2 operate as offset voltage sources during the period in which the first clock signal CLK1 is at L level.

The adjuster 22n adjusts the third reference signal or the fourth reference signal using the feedback signal Vfn in synchronism with one of the first clock signal CLK1 and the second clock signal CLK2. The feedback signal Vfn corresponds to the common mode component of the pair of two output signals Von and Vop. The adjuster 22n includes a CMFB circuit 108. The CMFB circuit 108 receives the pair of two output signals Von and Vop, the common level reference signal Vcm, the first clock signal CLK1, and the second clock signal CLK2. The CMFB circuit 108 supplies the feedback signal Vfn to the third reference node n5 or fourth reference node n6 so as to maintain the common mode component of the two output signals Von and Vop at an appropriate value. That is, the CMFB circuit 108 obtains the difference of the common mode component of the two output signals Vop and Von with respect to the common level reference signal Vcm to generate a feedback signal Vfn in synchronism with the first clock signal CLK1 or second clock signal CLK2. The CMFB circuit 108 supplies the generated feedback signal Vfn to the third reference node n5 or fourth reference node n6 to control the bias voltage (reference signal) of the gate of the PMOS transistor or NMOS transistor.

As shown in FIG. 3, when the adjuster 22n supplies the feedback signal Vfn to the fourth reference node n6, the third transfer portion 21n and the fourth transfer portion 23n perform the following operation. The third bias voltage Vbias1' is held at the third reference node n5 as a third reference signal. The third transfer portion 21n obtains the difference of the intermediate signal Van with respect to the third reference signal to generate a third signal in synchronism with the first clock signal CLK1, and transfers it to the gate of the PMOS transistor M5. The fourth transfer portion 23n holds a voltage, obtained by adding the feedback signal Vfn to the fourth bias voltage Vbias2', at the fourth reference node n6 as a fourth reference signal. That is, the fourth transfer portion 23n receives the fourth bias voltage Vbias2' as a fourth reference signal before adjustment, and adjusts the fourth bias voltage Vbias2' using the feedback signal Vfn, thereby obtaining the adjusted fourth reference signal. The fourth transfer portion 23n obtains the difference of the intermediate signal Van with respect to the adjusted fourth reference signal to generate a fourth signal. The fourth transfer portion 23n transfers the generated fourth signal to the gate of the NMOS transistor M6. With this operation, the PMOS transistor M5 and NMOS transistor M6 perform an amplification operation so that the common mode component of the pair of two output signals Vop and Von becomes the reference value (common level reference signal Vcm) to generate and output an output signal Von. Although FIG. 3 exemplifies a case in which feedback signals each corresponding to the common mode component of a pair of two output signals are fed back to the second reference node n8 and fourth reference node n6, such feedback signals may be fed back to the first reference node n7 and third reference node n5, as will be described in the second embodiment.

In this manner, in this embodiment, feedback signals each corresponding to the common mode component of a pair of two output signals are fed back to one of two sets of reference nodes of two class AB amplifiers to adjust one of two reference signals. The first transfer portion and the third transfer portion obtain the differences of intermediate signals with respect to two reference signals to generate a first signal and a third signal, respectively, and transfer them to the gates of the PMOS transistors. Also, the second transfer portion and the fourth transfer portion obtain the differences of intermediate signals with respect to two reference signals to generate a second signal and a fourth signal, respectively, and transfer them to the gates of the NMOS transistors. This obviates the need to use an inverting amplifier in order to feed back feedback signals, and therefore makes it possible to reduce power consumption.

If a plurality of poles that are phase delay factors occur within the CMFB loop, the stability of the CMFB operation deteriorates. To prevent this, in this embodiment, the occurrence of poles is essentially limited to the output node in the second stage (class AB amplifier). This makes it possible to reduce power consumed to meet a given stability.

Hence, power consumed in a common mode feedback (CMFB) operation can be reduced in a fully-differential amplifier circuit.

The operation of the fully-differential amplifier circuit 200 according to the embodiment of the present invention will be explained in more detail with reference to FIG. 2. FIG. 2 is a timing chart showing the waveforms of clock signals in the embodiment of the present invention.

Charges are sampled in the capacitors C1 to C4 during the period φ1 in which the first clock signal CLK1 is at H level. At this time, flicker noise generated by the input transistor M1 and input transistor M2 acts as a voltage output and is transferred to the nodes n1 and n2.

The charges are held in the capacitors C1 to C4 during the period in which the second clock signal CLK2 is at H level. With this operation, the capacitors C1 to C4 operate as offset voltage sources, so the PMOS transistors M3 and M5 and NMOS transistors M4 and M6 perform amplification operations. During the period φ2 that begins the non-overlapping period ΔT after the end of the period φ1, the offset voltage sources generate voltage values containing the flicker noise.

Because the frequencies of the first clock signal CLK1 and second clock signal CLK2 are set higher than those in the frequency range in which flicker noise is present, little fluctuation in flicker noise voltage occurs during transition from the period φ1 to the period φ2. Hence, in an amplification operation during the period φ2, most flicker noise of a differential pair (input transistors M1 and M2), which is absorbed by the offset voltage sources during the period φ1, is not transferred to the transistors M3 to M6. That is, no autozeroing technique is necessary, unlike a general amplifier. This makes it possible to eliminate any flicker noise without negative feedback that entails an increase in power consumed to meet a given stability.

An example of the circuit configuration of a fully-differential amplifier circuit 200i according to the first embodiment will be explained next with reference to FIG. 3. FIG. 3 is a circuit diagram illustrating an example of the circuit configuration of the fully-differential amplifier circuit 200i according to the first embodiment of the present invention. Detailed points of the embodiment will mainly be explained below. Note that constituent elements denoted by reference numerals attached with suffixes i in FIG. 3 correspond to those denoted by reference numerals attached with no suffixes i in FIG. 1. Also, constituent elements denoted by reference numerals attached with apostrophes in FIG. 3 are practically the same as those denoted by reference numerals attached with no apostrophes in FIG. 1.

The fully-differential amplifier circuit 200i includes a differential amplifier 10i and two class AB amplifiers 20pi and 20ni. The differential amplifier 10i includes load elements 103i and 104i. The load element 103i serves to appropriately determine the steady-state voltage of a node n1 and includes, for example, a resistor 113. The load element 104i serves to appropriately determine the steady-state voltage of a node n2 and includes, for example, a resistor 114.

The class AB amplifier 20pi includes a first transfer portion 21pi, second transfer portion 23pi, and adjuster 22pi. The adjuster 22pi feeds back a feedback signal Vfp to the second transfer portion 23pi. More specifically, the first transfer portion 21pi includes a first portion 1051, which forms a part of a class AB bias switching circuit 105. When a first clock signal CLK1 becomes active level, the first portion 1051 supplies a first bias voltage Vbias1 to a first reference node n7 as a first reference signal. At this time, a reference electrode E32 of a capacitor C3 receives the first bias voltage Vbias1 serving as a first reference signal via the first reference node n7. Next, when the first clock signal CLK1 changes to inactive level, the reference electrode E32 of the capacitor C3 generates a first signal as the difference of an intermediate signal Vap with respect to the first bias voltage Vbias1 serving as a first reference signal. At this time, the intermediate signal Vap is supplied to a signal electrode E31 of the capacitor C3. The first signal is supplied to the gate of a PMOS transistor M3. Note that the first bias voltage Vbias1 serving as a first reference signal determines the drain current of the PMOS transistor M3 in a steady state.

The second transfer portion 23pi includes a second portion 1052, which forms another part of the class AB bias switching circuit 105. When the first clock signal CLK1 becomes active level, the second portion 1052 supplies, as a second reference signal, a voltage generated by distributing charges held in capacitors C7 and C8 to capacitors C5 and C6. A reference electrode E42 of a capacitor C4 receives the second reference signal via a second reference node n8. Also, when the first clock signal CLK1 becomes active level, the adjuster 22pi supplies the feedback signal Vfp to the second reference node n8. The reference electrode E42 of the capacitor C4 receives the feedback signal Vfp via the second reference node n8. With this operation, the reference electrode E42 of the capacitor C4 generates a second signal as the difference of the intermediate signal Vap with respect to the adjusted second reference signal, obtained by adding the feedback signal Vfp to the second reference signal, when the first clock signal CLK1 becomes active level. At this time, the intermediate signal Vap is supplied to a signal electrode E41 of the capacitor C4. The second signal is supplied to the gate of an NMOS transistor M4. A second bias voltage Vbias2 determines the drain current of the NMOS transistor M4 in a steady state.

The fully-differential amplifier circuit 200i will be explained in more detail below. The first portion 1051 includes a switch s1. The switch s1 supplies the first bias voltage Vbias1 to the first reference node n7 as a first reference signal upon being turned on during the period (sampling period) in which the first clock signal CLK1 is at H level (active level). With this operation, the capacitor C3 samples the intermediate signal Vap with reference to the first bias voltage Vbias1 serving as a first reference signal. After that, the switch s1 is turned off during the period (hold period) in which the first clock signal CLK1 is at L level. With this operation, the capacitor C3 generates and holds a first signal as the difference of the intermediate signal Vap with respect to the first bias voltage Vbias1 serving as a first reference signal, and transfers the generated first signal to the gate of the PMOS transistor M3.

A switch s7 supplies the second bias voltage Vbias2 to a node n4 as a second reference signal before adjustment upon being turned on during the period in which the second clock signal CLK2 is at H level (active level). With this operation, the voltage of the node n4 becomes the second bias voltage Vbias2. After that, the switch s7 is turned off when the second clock signal CLK2 changes to L level. With this operation, the node n4 holds the second bias voltage Vbias2 as a second reference signal before adjustment.

A switch s4 supplies the second reference signal before adjustment, held at the node n4, to the second reference node n8 via a node n3 upon being turned on during the period (sampling period) in which the first clock signal CLK1 is at H level. Also, the adjuster 22pi includes a CMFB circuit 107i. The CMFB circuit 107i supplies the adjusted second reference signal to the second reference node n8 in synchronism with the first clock signal CLK1. With this operation, the capacitor C4 samples the intermediate signal Vap with reference to a signal (Vbias2+Vfp). After that, the switch s4 is turned off during the period (hold period) in which the first clock signal CLK1 is at L level. With this operation, the capacitor C4 generates and holds a second signal as the difference of the intermediate signal Vap with respect to the signal (Vbias2+Vfp), and transfers the generated second signal to the gate of the NMOS transistor M4.

More specifically, the CMFB circuit 107i includes a first capacitor C6, second capacitor C5, fifth capacitor C8, and sixth capacitor C7. The CMFB circuit 107i includes a second switch group including switches s6 and s8 and a first switch group including switches s3 and s5. As shown in FIG. 3, the fifth capacitor C8 is connected in parallel with the first capacitor C6 via the switches s4 and s5 during the sampling period (the period in which the first clock signal CLK1 is at H level). The sixth capacitor C7 is connected in parallel with the second capacitor C5 via the switches s3 and s4 during the sampling period. One electrode of the fifth capacitor C8 and one electrode of the sixth capacitor C7 are connected to each other and both are connected to the second bias voltage Vbias2 via the switch s7 during the hold period (the period in which the second clock signal CLK2 is at H level). The other electrode of the fifth capacitor C8 and the other electrode of the sixth capacitor C7 are supplied with common level reference signals Vcm via the switches s6 and s8 during the hold period. The common level reference signal Vcm is set by a bias voltage generating circuit 101 in order to match the common level of a first output signal Von and a second output signal Von with a target value. A CMFB circuit 108i includes a third capacitor C6', fourth capacitor C5', seventh capacitor C8', and eighth capacitor C7' as the counterparts of the first, second, fifth, and sixth capacitors, respectively, in the CMFB circuit 107i.

One electrode of the first capacitor C6 receives the first output signal Vop of the pair of two output signals Vop and Von and is connected to the switch s5. One electrode of the second capacitor C5 receives the second output signal Von of the pair of two output signals Vop and Von and is connected to the switch s3. The other electrode of the first capacitor C6 and the other electrode of the second capacitor C5 are connected to each other at the node n3 and both are connected to the second reference node n8 via the node n3.

One electrode of the fifth capacitor C8 is connected to the switches s5 and s8. One electrode of the sixth capacitor C7 is connected to the switches s3 and s6. The other electrode of the fifth capacitor C8 and the other electrode of the sixth capacitor C7 are connected to each other at the node n4 and both are connected to the switches s4 and s7 via the node n4.

The second switch group including the switches s6 and s8 connects one electrode of the fifth capacitor C8 and one electrode of the sixth capacitor C7 to the bias voltage generating circuit 101 (see FIG. 1) in synchronism with the second clock signal CLK2. With this operation, one electrode of the fifth capacitor C8 and one electrode of the sixth capacitor C7 are supplied with the common level reference signals Vcm serving as CMFB operation reference signals.

The first switch group including the switches s3 and s5 connects one electrode of the first capacitor C6 to one electrode of the fifth capacitor C8 and connects one electrode of the second capacitor C5 to one electrode of the sixth capacitor C7 in synchronism with the first clock signal CLK1. With this operation, the common level reference signals Vcm are transferred to one electrode of the first capacitor C6 and one electrode of the second capacitor C5. As a result, the first capacitor C6 and second capacitor C5 generate feedback signals Vfp as the differences of the common mode component of the pair of two output signals Vop and Von with respect to the common level reference signals Vcm, and supply the generated feedback signals Vfp to the node n3.

Note that the class AB amplifier 20ni has the same configuration as that of the class AB amplifier 20pi, and a description of the class AB amplifier 20ni will not be given.

As indicated in parentheses in FIG. 3, the first switch group including the switches s3 and s5 may be turned on in synchronism with the second clock signal CLK2, and the second switch group including the switches s6 and s8 may be turned on in synchronism with the first clock signal CLK1. In this case, the switch s7 is turned on during the period in which the first clock signal CLK1 is at H level, and the switch s4 is turned on during the period in which the second clock signal CLK2 is at H level. The second portion 1052 supplies the adjusted second reference signal to the reference electrode E42 of the capacitor C4 in synchronism with the second clock signal CLK2. That is, the adjuster 22pi generates a second signal as the difference of the intermediate signal Vap with respect to the second bias voltage Vbias2 and feedback signal Vfp in synchronism with the second clock signal CLK2, and transfers the generated second signal to the gate of the NMOS transistor M4.

The CMFB operation in the fully-differential amplifier circuit 200i according to the first embodiment of the present invention will be explained in detail next. During the period $\phi 2$ in which the second clock signal CLK2 is at H level, voltages Vcm-Vbias2 are stored in the capacitors C7 and C8 via the switches s6 to s8. During the period $\phi 1$ in which the first clock signal CLK1 is at H level, charges converted from these voltages are distributed again to the capacitors C5 and C6 via the switches s3 to s5. As a result of a plurality of times of this iterative sequence, the midpoint potential of the output signals Von and Vop becomes nearly equal to the common level reference signal Vcm, and the potential of the node n3 becomes nearly equal to that of the node n4. Hence, the drain current of the NMOS transistor M4 in a steady state takes a value determined by the second reference signal.

During the period $\phi 1$, the PMOS transistor M3 has its gate biased by the first bias voltage Vbias1 serving as a first reference signal via the switch s1. With this operation, the drain current of the PMOS transistor M3 in a steady state takes a value determined by the first bias voltage Vbias1 serving as a first reference signal. Hence, appropriately setting the first bias voltage Vbias1 and second bias voltage Vbias2 makes it possible to perform class AB biasing for the common-source stage and to reduce power consumption in a steady state.

A case in which the common mode voltage of the outputs Vop and Von rises due to some cause will be considered herein. An increment of the common mode voltage is transferred to the node n3 via the second capacitor C5 and first capacitor C6. Alternatively, as indicated in parentheses in FIG. 3, the first switch group including the switches s3 and s5 are turned on in synchronism with the second clock signal CLK2, and the second switch group including the switches s6 and s8 are turned on in synchronism with the first clock signal CLK1. In this case, an increment of the common mode voltage is transferred to the node n3 via the capacitors C5 and C7 and the capacitors C6 and C8. As the voltage of the node n3 rises, the drain current of the NMOS transistor M4 rises, so the potential of the output signal Vop drops. At this time, the same phenomenon occurs in the class AB amplifier 20ni, so the potential of the output signal Von drops. In this manner, as the common mode component of the output signals Vop and Von rises, the potentials of both the output signals Vop and Von drop by feedback. This mechanism thus realizes a CMFB function. Also when the common mode component drops, the same mechanism acts to drop the drain currents of the NMOS transistors M4 and M6 and thus realizes a CMFB function.

In contrast, a case in which the output differential signals change, such as a case in which the output signal Vop rises by ΔV and the output signal Von drops by ΔV, will be considered. In this case, assuming that the second capacitor C5 (or the capacitors C5 and C7) and the first capacitor C6 (or the capacitors C6 and C8) have nearly equal capacitances, the potential of the node n3 practically does not fluctuate. Hence, the drain current of the NMOS transistor M4 remains unchanged. The same applies to the class AB amplifier 20ni, so the drain current of the NMOS transistor M6 remains unchanged as well. In other words, the differential output signals do not influence the output voltages via the second capacitor C5, first capacitor C6, fourth capacitor C5', and third capacitor C6'.

Figure 4:
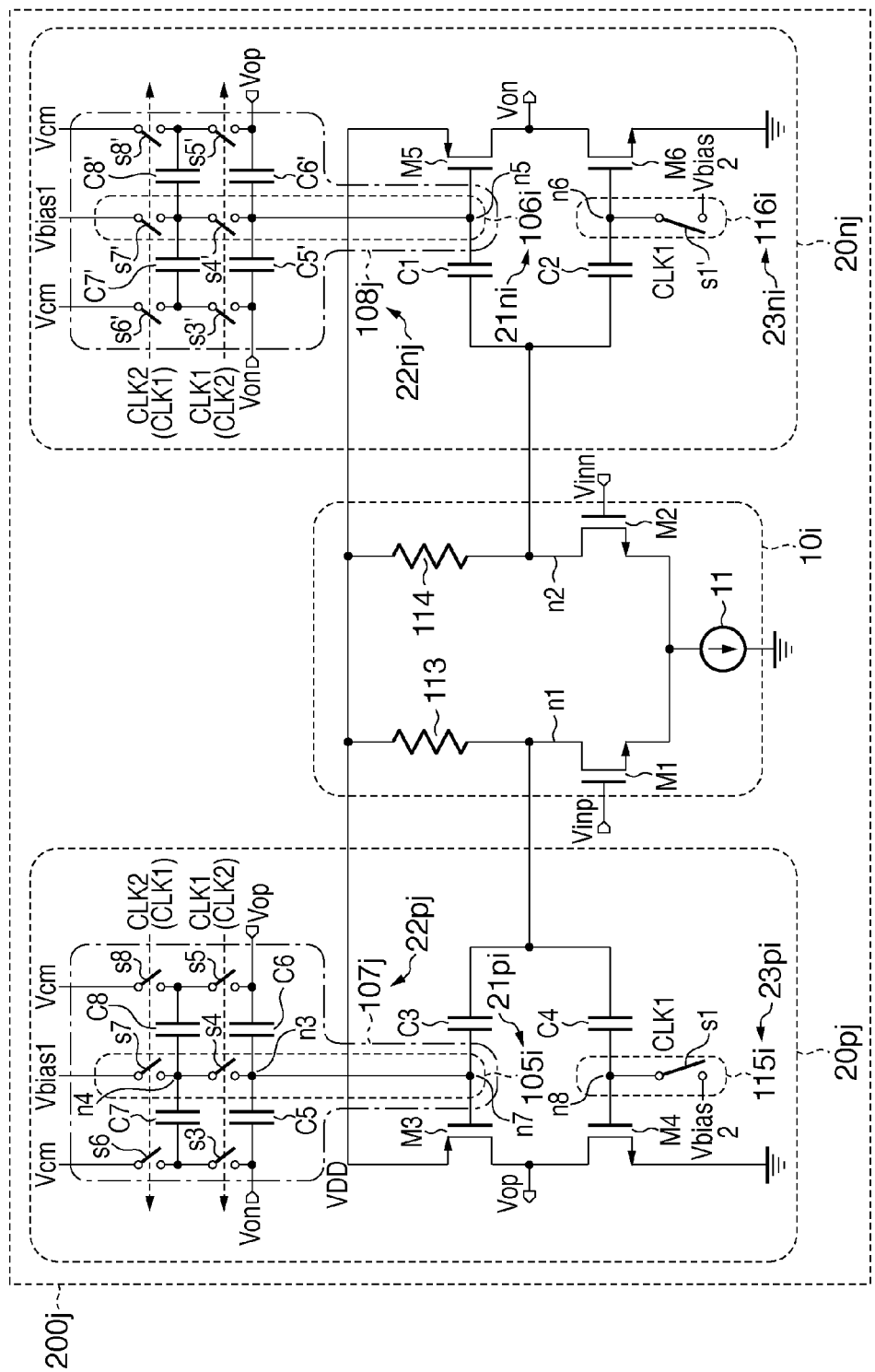
FIG. 4 is a circuit diagram illustrating an example of the circuit configuration of a fully-differential amplifier circuit 200$j$ according to the second embodiment of the present invention.

An example of the circuit configuration of a fully-differential amplifier circuit 200j according to the second embodiment of the present invention will be explained next with reference to FIG. 4. FIG. 4 is a circuit diagram illustrating an example of the circuit configuration of the fully-differential amplifier circuit 200j according to the second embodiment of the present invention. Points different from those in the first embodiment will mainly be explained below. Note that constituent elements denoted by reference numerals attached with suffixes j in FIG. 4 correspond to those denoted by reference numerals attached with no suffixes j in FIG. 1. Also, constituent elements denoted by reference numerals attached with apostrophes in FIG. 4 are practically the same as those denoted by reference numerals attached with no apostrophes in FIG. 1.

As shown in FIG. 4, when an adjuster 22p supplies a feedback signal Vfp to a first reference node n7, a first transfer portion 21p and a second transfer portion 23p perform the following operation. A second bias voltage Vbias2 is held at a second reference node n8 as a second reference signal. The second transfer portion 23p obtains the difference of an intermediate signal Vap with respect to the second reference signal to generate a second signal in synchronism with a first clock signal CLK1, and transfers it to the gate of an NMOS transistor M4. The first transfer portion 21p holds a voltage, obtained by adding the feedback signal Vfp to a first bias voltage Vbias1, at the first reference node n7 as a first reference signal. That is, the first transfer portion 21p receives the first bias voltage Vbias1 as a first reference signal before adjustment, and adjusts the first bias voltage Vbias1 using the feedback signal Vfp, thereby obtaining the adjusted first reference signal. The first transfer portion 21p obtains the difference of the intermediate signal Vap with respect to the adjusted first reference signal to generate a first signal. The first transfer portion 21p transfers the generated first signal to the gate of a PMOS transistor M3. With this operation, the PMOS transistor M3 and NMOS transistor M4 perform an amplification operation so that the common mode component of a pair of two output signals Vop and Von becomes a reference value (common level reference signal Vcm) to generate and output an output signal Vop.

As shown in FIG. 4, when an adjuster 22n supplies a feedback signal Vfn to a third reference node n5, a third transfer portion 21n and fourth transfer portion 23n perform the following operation. A fourth bias voltage Vbias2' is held at a fourth reference node n6 as a fourth reference signal. The fourth transfer portion 23n obtains the difference of an intermediate signal Van with respect to the fourth reference signal to generate a fourth signal in synchronism with the first clock signal CLK1, and transfers it to the gate of an NMOS transistor M6. The third transfer portion 21n holds a voltage, obtained by adding the feedback signal Vfn to a third bias voltage Vbias1', at the third reference node n5 as a third reference signal. That is, the third transfer portion 21n receives the third bias voltage Vbias1' as a third reference signal before adjustment, and adjusts the third bias voltage Vbias1' using the feedback signal Vfn, thereby obtaining the adjusted third reference signal. The third transfer portion 21n obtains the difference of the intermediate signal Van with respect to the adjusted third reference signal to generate a third signal. The third transfer portion 21n transfers the generated third signal to the gate of the PMOS transistor M5. With this operation, the PMOS transistor M5 and NMOS transistor M6 perform an amplification operation so that the common mode component of the pair of two output signals Vop and Von becomes the reference value (common level reference signal Vcm) to generate and output an output signal Von.

The fully-differential amplifier circuit 200j includes two class AB amplifiers 20pj and 20nj. The class AB amplifier 20pj includes a first transfer portion 21pj and adjuster 22pj. The adjuster 22pj supplies the feedback signal Vfp to the first reference node n7. The adjuster 22pj includes a CMFB circuit 107j. The CMFB circuit 107j supplies the feedback signal Vfp to the first reference node n7 in synchronism with the first clock signal CLK1. A reference electrode E32 of a capacitor C3 receives the feedback signal Vfp via the first reference node n7. With this operation, the capacitor C3 generates a first signal as the difference of the intermediate signal Vap with respect to the adjusted first reference signal, obtained by adding the feedback signal Vfp to the first bias voltage Vbias1 serving as the first reference signal before adjustment, in synchronism with the first clock signal CLK1. At this time, a signal electrode E31 of the capacitor C3 is supplied with the intermediate signal Vap. The capacitor C3 transfers the generated first signal to the gate of the PMOS transistor M3. Hence, a fluctuation in common level reference signal Vcm of the output signals Vop and Von is suppressed upon changes in drain current of the PMOS transistors M3 and M5.

As shown in the above-mentioned embodiments and examples, the feedback destination of a feedback signal supplied by a CMFB circuit may be set to the gate of either of the common-source NMOS transistor and the PMOS transistor. A CMFB effect can be obtained even when one of the feedback destinations of feedback signals supplied by the CMFB circuits in the two class AB amplifiers 20pj and 20nj is set to the gate of the NMOS transistor and the other one is set to the gate of the PMOS transistor.

Figure 5:
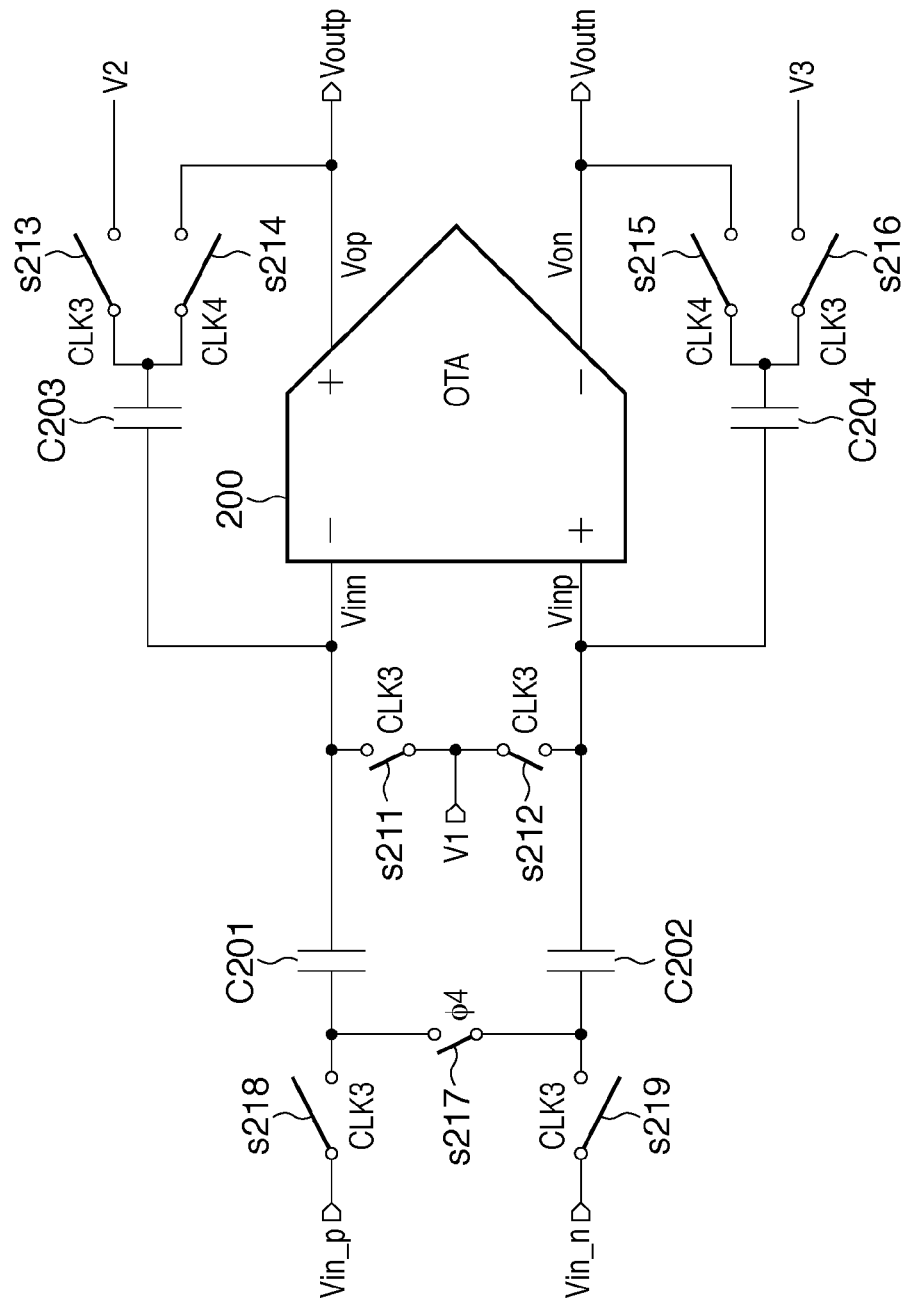
FIG. 5 is a circuit diagram showing an S/H application to which the fully-differential amplifier circuit 200 according to the embodiment of the present invention is applied.

FIG. 5 shows one example of an S/H application to which the fully-differential amplifier circuit 200 according to the present invention is applied. FIG. 5 is a circuit diagram showing an S/H application to which the fully-differential amplifier circuit 200 according to the embodiment of the present invention is applied.

An OTA 200 in FIG. 5 corresponds to the fully-differential amplifier circuit according to the present invention. Note that clock signals CLK3 and CLK4 are two-phase non-overlapping clocks that become H level during periods φ3 and φ4 nearly coinciding the periods φ1 and φ2 shown in FIG. 2. Reference symbol V1 denotes an arbitrarily set common mode voltage input to the OTA 200.

The operation of this circuit will be explained below. During the period φ3, the differential voltage between an input Vin_p and the arbitrary voltage V1 is sampled in a capacitor C201 via switches s218 and s211. Also, the differential voltage between an input Vin_n and the arbitrary voltage V1 is sampled in a capacitor C202 via switches s219 and s212. Simultaneously, the differential voltage between an arbitrary voltage V2 and the arbitrary voltage V1 is sampled in a capacitor C203 via a switch s213 and the switch s211. Also, the differential voltage between an arbitrary voltage V3 and the arbitrary voltage V1 is sampled in a capacitor C204 via a switch s216 and the switch s212. The OTA 200 enters a sampling state.

During the period φ4, switches s217, s214, and s215 short-circuit. Since OTA inputs Vinn and Vinp virtually short-circuit, charges stored in the capacitors C201 and C202 in the period φ3 are transferred to the capacitors C203 and C204, respectively, and the OTA 200 changes to a hold state.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-119076, filed May 15, 2009, and NO. 2010-099067, filed Apr. 22, 2010, which are hereby incorporated by reference herein in their entirety.

What is claimed is:

1. A fully-differential amplifier circuit comprising:
a differential amplifier configured to differentially amplify a first input signal and a second input signal serving as an input differential pair to generate a pair of a first intermediate signal and a second intermediate signal, the differential amplifier including a first input transistor configured to receive the first input signal, a second input transistor configured to receive the second input signal, a first load element arranged in series with the first input transistor, a second load element arranged in series with the second input transistor, and a current source commonly provided to the first input transistor and the second input transistor;
a first class AB amplifier configured to amplify the first intermediate signal to generate a first output signal; and
a second class AB amplifier configured to amplify the second intermediate signal to generate a second output signal,
wherein the first output signal and the second output signal serve as an output differential pair,
the first class AB amplifier amplifies the first intermediate signal with reference to a reference voltage adjusted by a first feedback signal that is a common mode component of the first output signal and the second output signal, and
the second class AB amplifier amplifies the second intermediate signal with reference to a reference voltage adjusted by a second feedback signal that is a common mode component of the first output signal and the second output signal.

2. A fully-differential amplifier circuit comprising:
a differential amplifier configured to differentially amplify a first input signal and a second input signal serving as an input differential pair to generate a pair of a first intermediate signal and a second intermediate signal;
a first class AB amplifier configured to amplify the first intermediate signal to generate a first output signal; and
a second class AB amplifier configured to amplify the second intermediate signal to generate a second output signal,
wherein the first output signal and the second output signal serve as an output differential pair,
the first class AB amplifier amplifies the first intermediate signal with reference to a reference voltage adjusted by a first feedback signal that is a common mode component of the first output signal and the second output signal, and
the second class AB amplifier amplifies the second intermediate signal with reference to a reference voltage adjusted by a second feedback signal that is a common mode component of the first output signal and the second output signal,
wherein the first class AB amplifier includes:
a first PMOS transistor which has a source connected to a power supply potential and is configured to output the first output signal from a drain thereof;
a first NMOS transistor which has a source connected to a ground potential and a drain connected to a drain of the first PMOS transistor;
a first transfer portion configured to transfer a first signal as a difference of the first intermediate signal with respect to a first reference signal to a gate of the first PMOS transistor;
a second transfer portion configured to transfer a second signal as a difference of the first intermediate signal with respect to a second reference signal to a gate of the first NMOS transistor; and
a first adjuster configured to receive the first output signal and the second output signal and adjust one of the first reference signal and the second reference signal using the first feedback signal, and
the second class AB amplifier includes:
a second PMOS transistor which has a source connected to the power supply potential and is configured to output the second output signal from a drain thereof;
a second NMOS transistor which has a source connected to the ground potential and a drain connected to a drain of the second PMOS transistor;
a third transfer portion configured to transfer a third signal as a difference of the second intermediate signal with respect to a third reference signal to a gate of the second PMOS transistor;
a fourth transfer portion configured to transfer a fourth signal as a difference of the second intermediate signal with respect to a fourth reference signal to a gate of the second NMOS transistor; and
a second adjuster configured to receive the first output signal and the second output signal and adjust one of the third reference signal and the fourth reference signal using the second feedback signal.

3. The circuit according to claim 2, wherein
the first adjuster includes:
a first capacitor configured to receive the first output signal at one electrode thereof; and
a second capacitor configured to receive the second output signal at one electrode thereof,
the other electrode of the first capacitor and the other electrode of the second capacitor are connected to each other and both are connected to a node at which one of the first reference signal and the second reference signal is to be held,
the second adjuster includes:
a third capacitor configured to receive the first output signal at one electrode thereof; and
a fourth capacitor configured to receive the second output signal at one electrode thereof, and
the other electrode of the third capacitor and the other electrode of the fourth capacitor are connected to each other and both are connected to a node at which one of the third reference signal and the fourth reference signal is to be held.

4. The circuit according to claim 3, wherein
the first adjuster includes:
a fifth capacitor configured to be connected in parallel with the first capacitor during a period in which the first intermediate signal is sampled; and
a sixth capacitor configured to be connected in parallel with the second capacitor during the period in which the first intermediate signal is sampled,
one electrode of the fifth capacitor and one electrode of the sixth capacitor are connected to each other and both are connected to one of a node supplied with the first reference signal and a node supplied with the second reference signal during a period in which the first intermediate signal is held,
the other electrode of the fifth capacitor and the other electrode of the sixth capacitor are connected to a common level reference signal set to match a common level of the first output signal and the second output signal with a target value during the period in which the first intermediate signal is held,
the second adjuster includes:
a seventh capacitor configured to be connected in parallel with the third capacitor during a period in which the second intermediate signal is sampled; and
an eighth capacitor configured to be connected in parallel with the fourth capacitor during the period in which the second intermediate signal is sampled,
one electrode of the seventh capacitor and one electrode of the eighth capacitor are connected to each other and both are connected to one of a node supplied with the third reference signal and a node supplied with the fourth reference signal during a period in which the second intermediate signal is held, and
the other electrode of the seventh capacitor and the other electrode of the eighth capacitor are connected to the common level reference signal during the period in which the second intermediate signal is held.

5. The circuit according to claim 3, wherein
the first adjuster includes:
a fifth capacitor configured to be connected in parallel with the first capacitor during a period in which the first intermediate signal is held; and
a sixth capacitor configured to be connected in parallel with the second capacitor during the period in which the first intermediate signal is held,
one electrode of the fifth capacitor and one electrode of the sixth capacitor are connected to each other and both are connected to one of a node supplied with the first reference signal and a node supplied with the second reference signal during a period in which the first intermediate signal is sampled,
the other electrode of the fifth capacitor and the other electrode of the sixth capacitor are connected to a common level reference signal set to match a common level of the first output signal and the second output signal with a target value during the period in which the first intermediate signal is sampled,
the second adjuster includes:
a seventh capacitor configured to be connected in parallel with the third capacitor during a period in which the second intermediate signal is held; and
an eighth capacitor configured to be connected in parallel with the fourth capacitor during the period in which the second intermediate signal is held,
one electrode of the seventh capacitor and one electrode of the eighth capacitor are connected to one of a node supplied with the third reference signal and a node supplied with the fourth reference signal during a period in which the second intermediate signal is sampled, and
the other electrode of the seventh capacitor and the other electrode of the eighth capacitor are connected to the common level reference signal during the period in which the second intermediate signal is sampled.

* * * * *